(12) United States Patent
Huang et al.

(10) Patent No.: US 9,812,613 B2
(45) Date of Patent: Nov. 7, 2017

(54) INTEGRATED LED LIGHT-EMITTING DEVICE AND FABRICATION METHOD THEREOF

(71) Applicant: XIAMEN SANAN OPTOELECTRONICS TECHNOLOGY CO., LTD., Xiamen (CN)

(72) Inventors: Shaohua Huang, Xiamen (CN); Xiaoqiang Zeng, Xiamen (CN); Chih-Wei Chao, Xiamen (CN)

(73) Assignee: XIAMEN SANAN OPTOELECTRONICS TECHNOLOGY CO., LTD., Xiamen (CN)

(*) Notice: Subject to any disclaimer, the term of this patent is extended or adjusted under 35 U.S.C. 154(b) by 0 days.

(21) Appl. No.: 15/289,145

(22) Filed: Oct. 8, 2016

(65) Prior Publication Data

US 2017/0025580 A1    Jan. 26, 2017

Related U.S. Application Data

(63) Continuation of application No. 14/748,921, filed on Jun. 24, 2015, now Pat. No. 9,472,726, which is a (Continued)

(30) Foreign Application Priority Data

May 24, 2013 (CN) .......................... 2013 1 0196146

(51) Int. Cl.
  *H01L 29/205* (2006.01)
  *H01L 33/00* (2010.01)
  (Continued)

(52) U.S. Cl.
  CPC ............ *H01L 33/385* (2013.01); *H01L 21/78* (2013.01); *H01L 24/14* (2013.01);
  (Continued)

(58) Field of Classification Search
  CPC ..... H01L 33/387; H01L 27/15; H01L 33/005; H01L 21/78; H01L 33/44; H01L 33/486;
  (Continued)

(56) References Cited

U.S. PATENT DOCUMENTS 3,947,840 A * 3/1976 Craford .................... G09G 3/32
                                                      148/DIG. 119
2002/0137245 A1* 9/2002 Kitamura ................. G02B 6/42
                                                              438/22
(Continued)

FOREIGN PATENT DOCUMENTS

WO    WO 2013/024428    * 2/2013 .................... 33/50

*Primary Examiner* — Victor A Mandala
(74) *Attorney, Agent, or Firm* — Syncoda LLC; Feng Ma; Junjie Feng

(57) ABSTRACT

A light-emitting diode (LED) includes: an epitaxial structure having an upper and a lower surface, wherein the upper surface comprises a light-emitting surface; at least one insulating layer over the lower surface; and an electrode pad layer over the at least one insulating layer; wherein: the electrode pad layer comprises a P electrode region and an N electrode region; and the at least one insulating layer is configured to adjust a distribution of the P and N electrode regions over the electrode pad layer.

11 Claims, 21 Drawing Sheets

Related U.S. Application Data continuation of application No. PCT/CN2014/071093, filed on Jan. 22, 2014.

(51) Int. Cl.

| | |
|---|---|
| *H01L 33/38* | (2010.01) |
| *H01L 33/48* | (2010.01) |
| *H01L 27/15* | (2006.01) |
| *H01L 33/44* | (2010.01) |
| *H01L 21/78* | (2006.01) |
| *H01L 25/075* | (2006.01) |
| *H01L 33/62* | (2010.01) |
| *H01L 23/00* | (2006.01) |

(52) U.S. Cl.
CPC .......... *H01L 25/0753* (2013.01); *H01L 27/15* (2013.01); *H01L 27/153* (2013.01); *H01L 33/005* (2013.01); *H01L 33/387* (2013.01); *H01L 33/44* (2013.01); *H01L 33/486* (2013.01); *H01L 33/62* (2013.01); *H01L 27/156* (2013.01); *H01L 33/382* (2013.01); *H01L 2224/16245* (2013.01); *H01L 2924/01322* (2013.01); *H01L 2924/12041* (2013.01); *H01L 2933/0016* (2013.01); *H01L 2933/0025* (2013.01); *H01L 2933/0033* (2013.01); *H01L 2933/0066* (2013.01)

(58) Field of Classification Search
CPC ................ H01L 24/14; H01L 25/0753; H01L 2924/12041; H01L 2933/0033; H01L 2933/0025; H01L 2933/0016; H01L 2924/01322; H01L 2224/16245; H01L 33/382; H01L 27/156; H01L 33/62
See application file for complete search history.

(56) References Cited

U.S. PATENT DOCUMENTS

| | | | | |
|---|---|---|---|---|
| 2007/0187712 A1* | 8/2007 | Yamada | ............. | H01L 33/0079 257/103 |
| 2011/0215358 A1* | 9/2011 | Hwang | .................. | H01L 27/15 257/98 |
| 2011/0220910 A1* | 9/2011 | Kojima | .................. | H01L 33/40 257/76 |
| 2011/0297989 A1* | 12/2011 | Murai | .................. | H01L 33/387 257/98 |
| 2012/0181561 A1* | 7/2012 | Fujimori | ............... | H01L 33/405 257/98 |
| 2013/0193453 A1* | 8/2013 | Donofrio | ............ | H01L 25/0753 257/88 |
| 2013/0214247 A1* | 8/2013 | Hu | ........................ | H01L 27/156 257/13 |
| 2015/0063393 A1* | 3/2015 | Iwata | ...................... | H01S 5/183 372/45.01 |
| 2015/0364665 A1* | 12/2015 | Lopez | .................. | H01L 33/382 257/99 |

\* cited by examiner

INTEGRATED LED LIGHT-EMITTING DEVICE AND FABRICATION METHOD THEREOF

CROSS-REFERENCE TO RELATED APPLICATIONS

The present application is a continuation of, and claims priority to, U.S. Ser. No. 14/748,921 filed on Jun. 24, 2015 (now U.S. Pat. No. 9,472,726), which claims priority to PCT/CN2014/071093 filed on Jan. 22, 2014, which claims priority to Chinese Patent Application No. 201310196146.3 filed on May 24, 2013. The disclosures of these applications are hereby incorporated by reference in their entirety.

BACKGROUND

Despite rapid advance of semiconductor lighting technology and breakthrough of technical difficulties in LED chip, leakage and module lamps, the mainstream lighting package method, basically of multi-chip structure in series or series-parallel connection, still requires complex operating steps including die bonding, wire bonding and phosphor coating for each LED chip. To solve the aforesaid problems, a high-voltage LED chip concept has been put forward and presented its advantages in actual application. However, conventional high-voltage chip is still restricted by such deflects as insufficient package welding, electrode shading and poor wiring stability of LEDs in grain.

SUMMARY

The present disclosure provides an integrated LED light-emitting device and fabrication method thereof, which can effectively improve the problems aforesaid.

According to a first aspect of the present disclosure, an integrated light emitting diode is provided, comprising, at least two mutually-isolated LED light-emitting epitaxial units having an upper and a lower surface, in which, the upper surface is a light-emitting surface; an electrode pad layer over the lower surface of the LED light-emitting epitaxial unit, with sufficient thickness for supporting the LED epitaxial unit and connecting to each LED light-emitting epitaxial unit to form a connection circuit plane with no height difference; and the electrode pad layer is divided into a P electrode region and an N electrode region.

The LED light-emitting epitaxial units constitute a series, parallel or series-parallel circuit.

The light-emitting device can be directly packaged over the supporting substrate through surface-mounted technology (SMT) package via the electrode pad layer.

In some embodiments, the electrode pad layer is formed through electroplating.

In some embodiments, the electrode pad layer is thicker than 50 µm to support the epitaxial film.

In some embodiments, areas of the P and N electrode regions over the electrode pad layer are basically same.

In some embodiments, at least one insulating layer is arranged between the electrode pad layer and the LED light-emitting epitaxial unit to adjust distribution of the P and N electrode regions over the electrode pad layer.

In some embodiments, at least two insulating layers are arranged between the electrode pad layer and the film LED light-emitting epitaxial unit, in which, the first insulating layer is to isolate the P and N regions of each film LED light-emitting epitaxial unit, and the second insulating layer is to guarantee that the P and N electrode regions over the electrode pad layer are basically same at size.

In some embodiments, an insulator is provided, which inserts into the electrode pad layer to divide the electrode pad layer under the LED light-emitting epitaxial unit into P and N regions, in which, the lower surface is not higher than the electrode pad surface. The P and N regions over the electrode pad layer are electrically isolated through the insulator with the gap between 20 and 100 µm. Further, in some preferred embodiments, the height difference between the insulator surface that is far from the light-emitting laminated layer and the electrode pad layer surface/the lower surface of the electrode pad layer is 20-100 µm. In some embodiments, melting point or softening point of the insulator is lower than melting points of the P and N electrode pads and the insulator can be made of colloid material like SU8, BCB or dry film. In some other preferred embodiments, the electrode pad layer and the insulator cover the entire surface of the LED epitaxial structure.

In the aforesaid light-emitting device, the P-type pad in single film LED is connected to the N-type pad of the adjacent independent LED light-emitting unit and formed under the lower surface and the connection circuit plane has no height difference.

According to a second aspect of the present disclosure, a fabrication method of integrated LED light-emitting device is provided, comprising:

Epitaxial growth: form a LED light-emitting epitaxial laminated layer over the growth substrate through epitaxial growth;

Fabrication of an electrode pad layer: determine a cutting path over the LED light-emitting laminated layer surface that divides the LED light-emitting laminated layer into a series of light-emitting units, in which, each unit surface is divided into a P electrode region, an N electrode region and an isolating region; fabricate an electrode pad layer over the LED light-emitting laminated layer that covers the cutting path and the P and N electrode regions with sufficient thickness to support the LED light-emitting epitaxial laminated layer; remove the growth substrate and the LED light-emitting epitaxial laminated layer of the cutting path to form a series of LED light-emitting epitaxial units connected by the electrode pad layer;

Device cutting: cut the aforesaid structures along the cutting path as required to form a series of integrated LED light-emitting devices comprising a plurality of LED light-emitting epitaxial units, and the P and N connection circuit of the adjacent film LED light-emitting epitaxial unit is a plane with no height difference. Specifically, in chip fabrication, the electrode pad layer can be made through electroplating.

In some embodiments, in the isolating region of the LED light-emitting laminated layer, fabricate an insulator to isolate the P and N electrode regions of the electrode pad layer, in which, the surface at the end far from the light-emitting laminated layer is at the same level of or is higher than the electrode pad layer surface. The P and N electrode regions over the electrode pad layer are electrically isolated through the insulator with a gap between 20 and 100 µm.

In some embodiments, fabrication of the electrode pad layer comprises that: at least two insulating layers are formed between the electrode pad layer and the film LED light-emitting epitaxial unit, in which, the first insulating layer is to isolate the P and N electrode regions of each film LED light-emitting epitaxial unit, and the second insulating layer is to guarantee that the P and N regions over the electrode pad layer are basically same at size.

In some embodiments, during fabrication of the electrode pad layer, the P and N electrode regions over the electrode pad layer of each unit are consistently distributed and in cutting step, a series of LED light-emitting unit arrays of series, parallel or series-parallel connection are formed by removing part of the electrode pad layer corresponding to the cutting path.

In some embodiments, in fabrication of the electrode pad layer, the LED light-emitting epitaxial units are distributed by row (column), in which, the P and N electrode regions at odd-number row (column) of the electrode pad layer are inversely distributed from the P and N electrode regions at even-number row (column) of the electrode pad layer of each unit, and in cutting step, an AC circuit connection is formed by removing part of the electrode pad layer corresponding to the cutting path.

According to some embodiments, the integrated LED light-emitting device has the advantages of conventional high-voltage series chip and series-parallel chips, which can improve electro-optical efficiency of the entire LED light-emitting device including the power supply. This integrated LED light-emitting device also has advantages in fabrication cost for it saves packaging body material: the LED light-emitting layer that is directly pasted over the pad has better heat dissipation effect than other pasting packaging body; in addition, the entire device area is smaller than that of the pasting packaging body. This integrated LED device can be coated with phosphor before chip cutting to form a wafer-level white light light-emitting device, thus forming pure parts good for batch usage. In terms of heat treatment, the integrated LED device has good heat dissipation for the thermal resistance of the packaging body is removed, thereby, extending the service life of the LED device.

The integrated LED light-emitting device structure disclosed in the present disclosure separates the light-emitting device and the path, making it easy to obtain multiple series-parallel structures. In comparison to conventional high-voltage series chip, it avoids high and low series circuit that may result in circuit failure and prevents surface shading limitation of circuit. A light-emitting system such as a display system or a lighting system can be provided employing a plurality of the integrated LED light-emitting devices.

DETAILED DESCRIPTION

The integrated LED light-emitting device and fabrication method thereof will be described in detail below with reference to the preferred embodiments and drawings. It is to be understood that by those skilled in the art that various changes may be made therein without influencing the beneficial effects of the present disclosure. Therefore, the descriptions below shall be understood as widely known by those skilled in the art and are not meant to limit the scope of the invention.

According to some embodiments, an integrated LED light-emitting device and fabrication method thereof is provided, in which, over the device structure, an electrode pad layer is used to support the light-emitting epitaxial structure and to connect each LED light-emitting epitaxial unit so as to form a connection circuit plane with no height difference, and the formed light-emitting device can be directly pasted over the supporting substrate; with regards to the fabrication method, a simplified LED light-emitting epitaxial unit is supported by an electrode pad layer for electric connection, and an integrated LED light-emitting device having a circuit connection plane with no height difference can be formed by cutting the electrode pad layer.

A detailed description will be given to the SMT light-emitting device and fabrication method thereof.

Embodiment 1

In this embodiment, for the convenience of description and simplification of drawings, three LED light-emitting units are taken to form an integrated LED light-emitting device. It is to be understood that the number of light-emitting units can be selected as per specific embodiments beyond such limitation.

Figure 1:
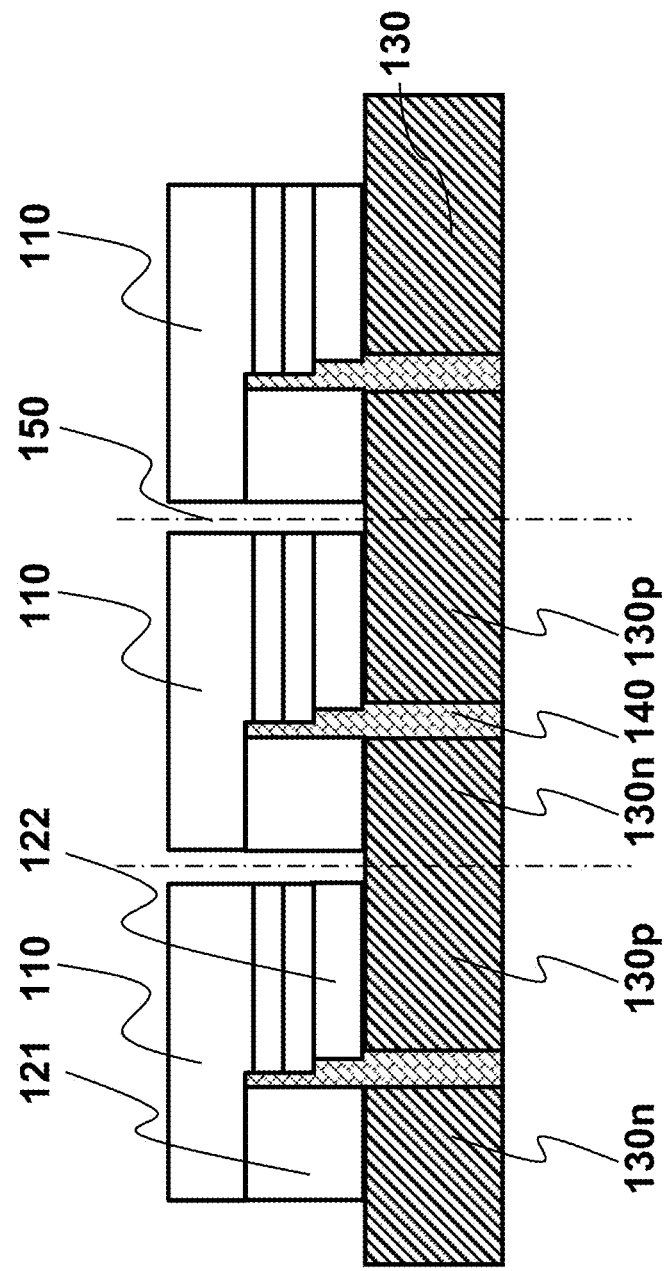
FIG. 1 is a structural section view of an integrated LED light-emitting device according to Embodiment 1 of the present disclosure.

With reference to FIG. 1, an integrated LED light-emitting device, comprising: light-emitting epitaxial units 110, ohmic contact layers 121, 122, an electrode pad layer 130 and an insulator 140. Specifically, in each light-emitting epitaxial unit 110, the epitaxial layers are mutually isolated from each other through the isolating path 150, and in some preferred embodiments, the isolating path 150 is filled with insulating material. The light-emitting epitaxial unit 110 is a flip-chip film structure, which from up to bottom comprises an N-type epitaxial layer, a light-emitting layer and a P-type epitaxial layer. However, it is not limited to these types of layers. The N-type ohmic contact layer 121 and the P-type ohmic contact layer 122 are over the N-type epitaxial layer and the P-type epitaxial layer respectively with parallel lower surfaces, which may be made of Ti, Ni, Ag, Pt, Au, Cr or TiW or any of their combinations. As a preferred embodiment, a multi-layer structure of high-reflectivity metal material is provided for ohmic contact and mirror reflection at the same time. An electrode pad layer 130, more than 50 μm thick, is over the P and N-type ohmic contact layers respectively, to support the flip-chip film structure 110, and the preferred thickness is 70-150 μm. The electrode pad 130 can be made of Ti, Ni, Cu, Au, AuSn, SnCu, SnBi or any of their combinations. The insulator 140 is between the P and N electrode pads 130p and 130n and fills in the gap between the N-type ohmic contact layer 121 and the P-type ohmic contact layer 122, which appears stepped shape and made of permanent insulating colloid, like SU8, BCB or dry film, etc.

In this embodiment, in each LED light-emitting unit, gap D between the P region 130p and the N region 130n over the electrode pad layer 130 is 20-150 µm. Except the LED light-emitting units at both ends, the P region over the electrode pad layer of each LED light-emitting unit is connected to the N region over the electrode pad layer of the adjacent LED light-emitting unit and correspondingly, the N region over the electrode pad layer of each LED light-emitting unit is connected to the P region over the electrode pad layer of the adjacent LED light-emitting unit, thus forming a circuit connection plane with no height difference. Further, the electrode pad layer edge is beyond that of the epitaxial structure within 30 µm to prevent the solder paste from climbing up the epitaxial layer due to solder paste backflow during later package, which may result in electric leakage of the device.

Figure 2:
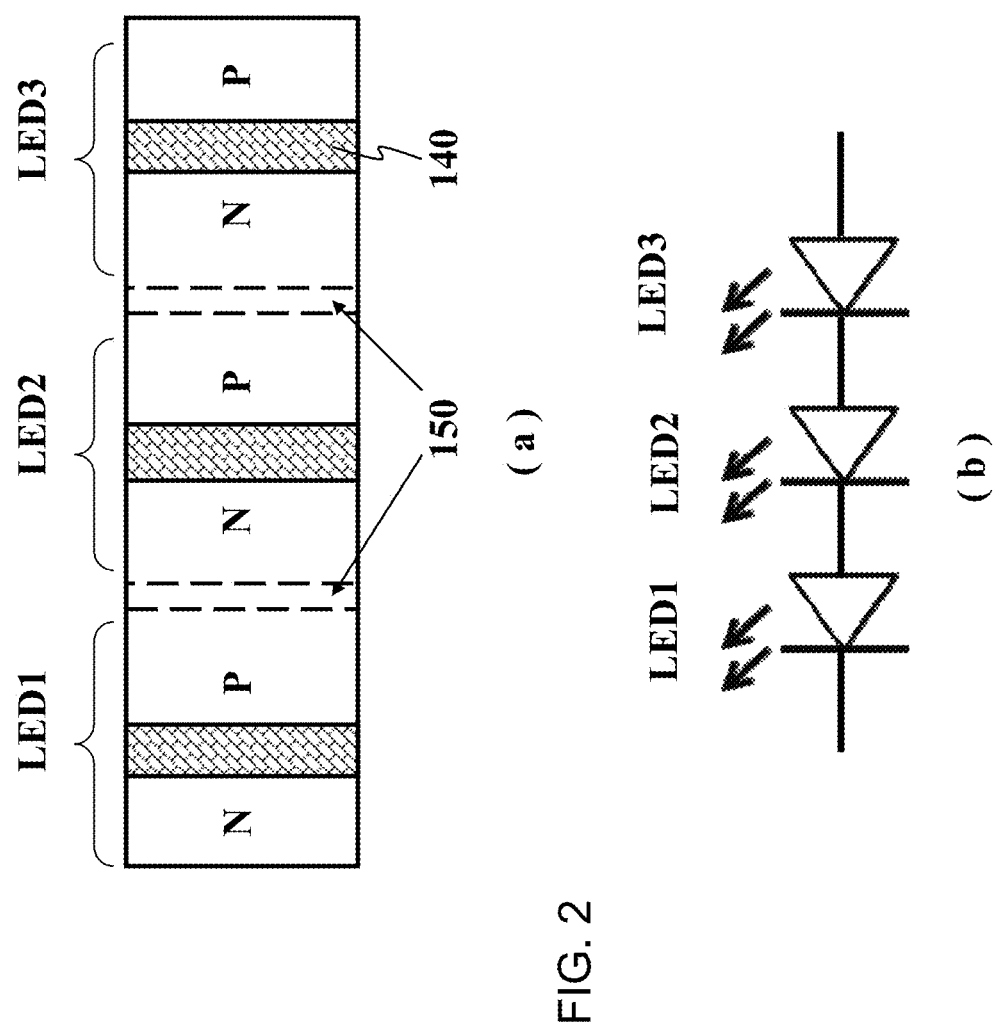
FIG. 2 is a bottom view and equivalent circuit diagram of the light-emitting device as shown in FIG. 1.

FIG. 2 is a bottom view and equivalent circuit diagram of the device as shown in FIG. 1, in which, P and N refer to the P and N regions over the electrode pad layer respectively. The LED light-emitting units form a series circuit connection through the electrode pad layer. Further, the electrode pad layer 130 and the insulator 140 of the device cover the entire surface of the LED epitaxial structure to ensure completeness of the epitaxial structure support and to effectively avoid damage of the flip-chip epitaxial film.

Embodiment 2

In some light-emitting devices of larger size, one important factor that influences device reliability is the shape and size of the P and N regions over the electrode pad layer. For example, in a known asymmetric electrode design, large area difference of electrodes may lead to chip inclination during eutectic process, resulting in eutectic failure at electrodes of small areas and causing final electric connection failure.

Figure 3:
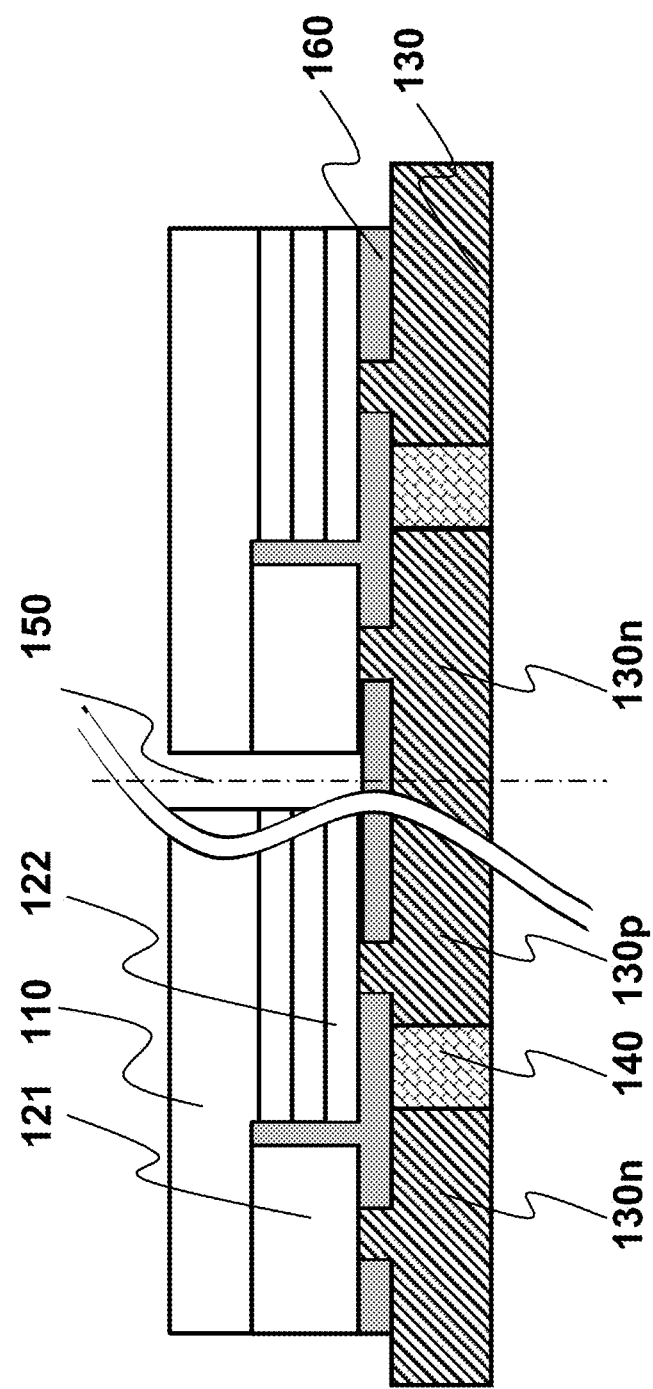
FIG. 3 is a structural section view of an integrated LED light-emitting device according to Embodiment 2.
Figure 4:
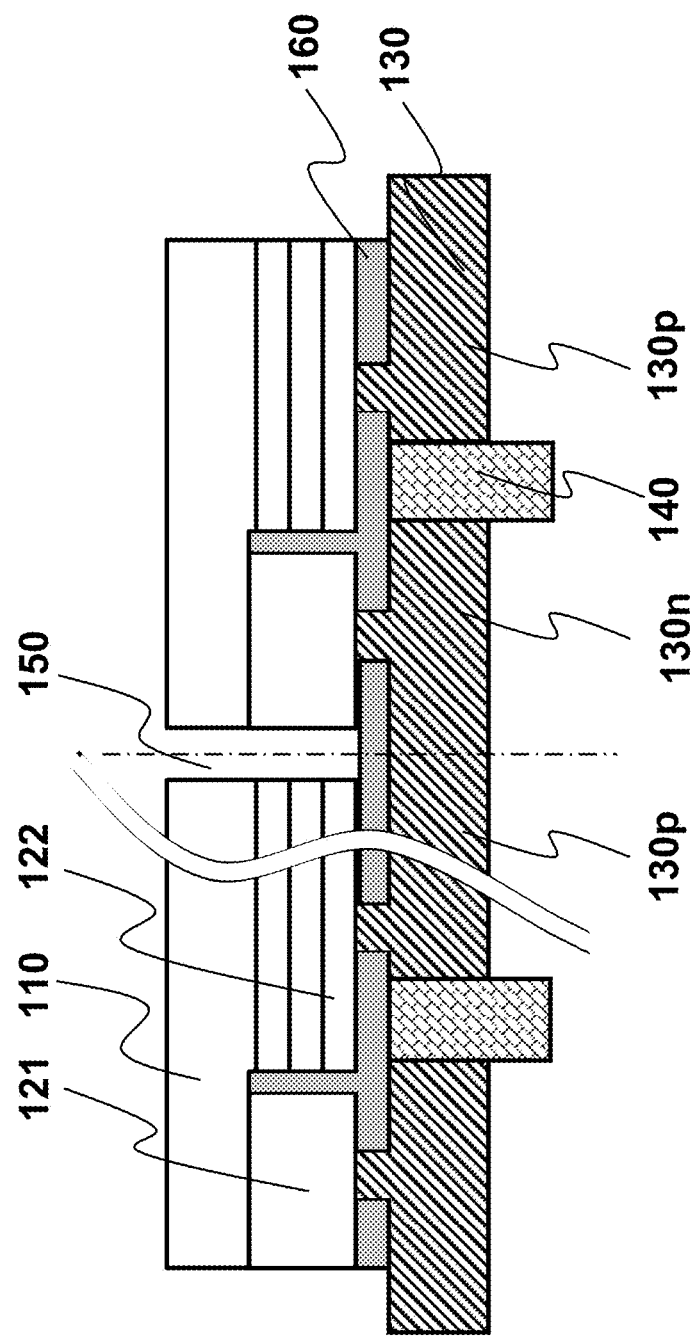
FIG. 4 is a structural section view of an integrated LED light-emitting device according to Embodiment 3.

With reference to FIG. 3, difference between this embodiment and Embodiment 1 is that: the P and N regions 130p and 130n over the electrode pad layer have approximate or basically same areas. Specifically, an insulating layer 160 is arranged between the P and N ohmic contact layers 122 and 121 to enable electric isolation between the N-type ohmic contact layer 121 and the light-emitting layer and the p-type epitaxial layer of the LED epitaxial structure. Open holes at positions of the insulating layer 160 corresponding to the P and N ohmic contact layers. The electrode pad layer fills through this opening structure and the P and N regions are contacted with the P and N ohmic contact layers respectively.

Embodiment 3

In this embodiment, the lower surface of the insulator 140 at the side that is far from the light-emitting epitaxial laminated layer extrudes the lower surface of the electrode pad layer 130, which effectively avoids short circuit of the P and N electrodes during later package of the device. It is assumed that height difference between the relative position of the lower surface of the electrode pad layer 130 and that of the lower surface of the insulator is H, and the gap between the P and N regions over the electrode pad layer is H, and implementation effect of the present embodiment can be optimized by adjusting H and D. In this embodiment, the height difference H can be 20-100 µm and preferably 50 µm, and the gap D can be 20-100 µm and preferably 50 µm.

Embodiment 4

Figure 5:
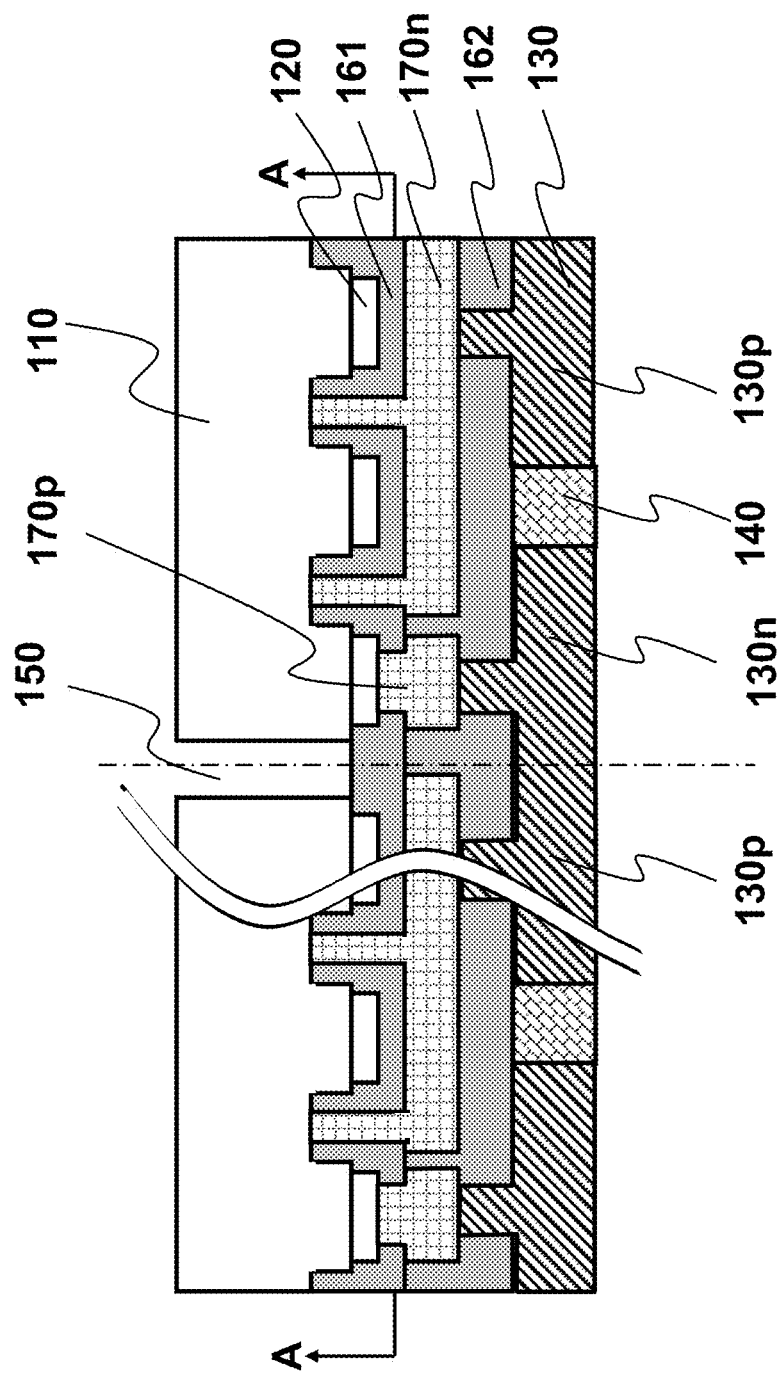
FIG. 5 is a structural section view of an integrated LED light-emitting device according to Embodiment 4.
Figure 6:
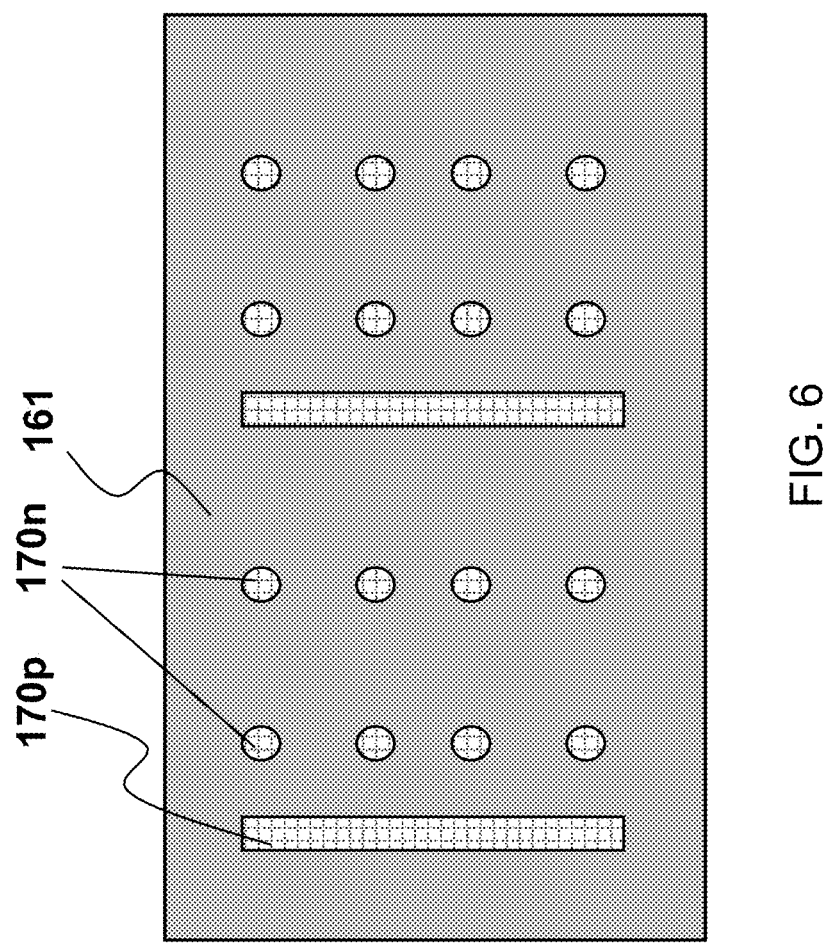
FIG. 6 is a section view along Line A-A of FIG. 5.

This embodiment optimizes the current injection structure of the LED epitaxial layer in Embodiment 2 and differs from Embodiment 2 in that: a dual insulating layer and a conducting layer structure are arranged between the P and N ohmic contact layers and the electrode pad layer, in which, in the first insulating layer and the conducting layer, current is uniformly injected to the LED epitaxial structure, and in the second insulating layer, areas of the P and N electrode pads are basically same. With reference to FIG. 5 and FIG. 6, in which, FIG. 6 is a sectional view along the first insulating layer 161. In the central regions of each LED light-emitting epitaxial unit 110, open a plurality of first opening structures that pass through the P-type epitaxial layer, the light-emitting layer and till the N-type epitaxial layer; cover an ohmic contact layer 120 over the P-type epitaxial layer surface and cover the first insulating layer 161 over the ohmic contact layer 120 and also the side wall of the opening structure to expose the N-type epitaxial layer; open at least one second hole structure at the position of the first insulating layer 161 corresponding to the ohmic contact layer 120; fabricate the conducting layer, which is divided into an N conducting region 170n and a P conducting region 170p, over the first insulating layer 161, in which, the N conducting region 170n contacts with the N-type epitaxial layer through the first opening structure and P conducting region 170p contacts with the ohmic contact layer 120 through the second opening structure; fabricate a second insulating layer 162 over the conducting layer and open a third opening structure at positions corresponding to the N conducting region 170n and the P conducting region 170p, in which, the electrode pad layer fills in this opening structure and the P and N regions contact with the P and N conducting regions over the conducting layer respectively.

Figure 7:
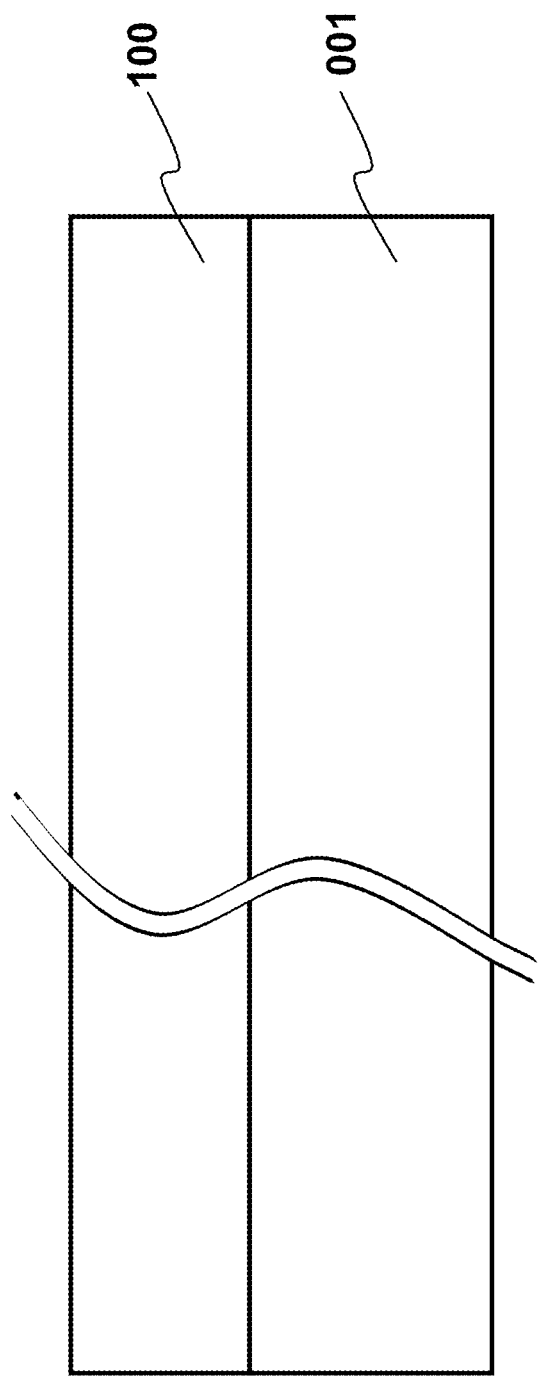
FIG. 7 illustrates a first step in a fabrication process of the light-emitting device as shown in FIG. 5.
Figure 8:
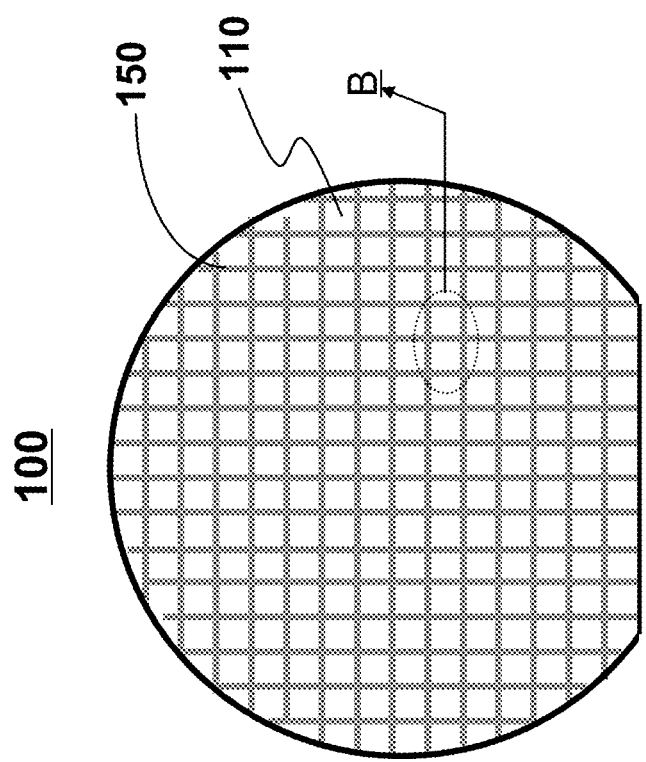
FIG. 8 illustrates a second step.

FIGS. 7-17 are schematic diagrams of fabrication of the light-emitting device as shown in FIG. 5, comprising three processes: epitaxial growth, chip fabrication and cutting, in which, FIGS. 9-16 are partial enlarging section diagrams of the B section in FIG. 8.

First step is epitaxial growth. Specifically: provide a growth substrate 100, over which, form a buffer layer, an N-type epitaxial layer, a light-emitting layer and a P-type epitaxial layer in successive, and this epitaxial laminated layer is 110, as shown in FIG. 7. This step can adopt conventional epitaxial growth process like MOCVD.

Figure 9:
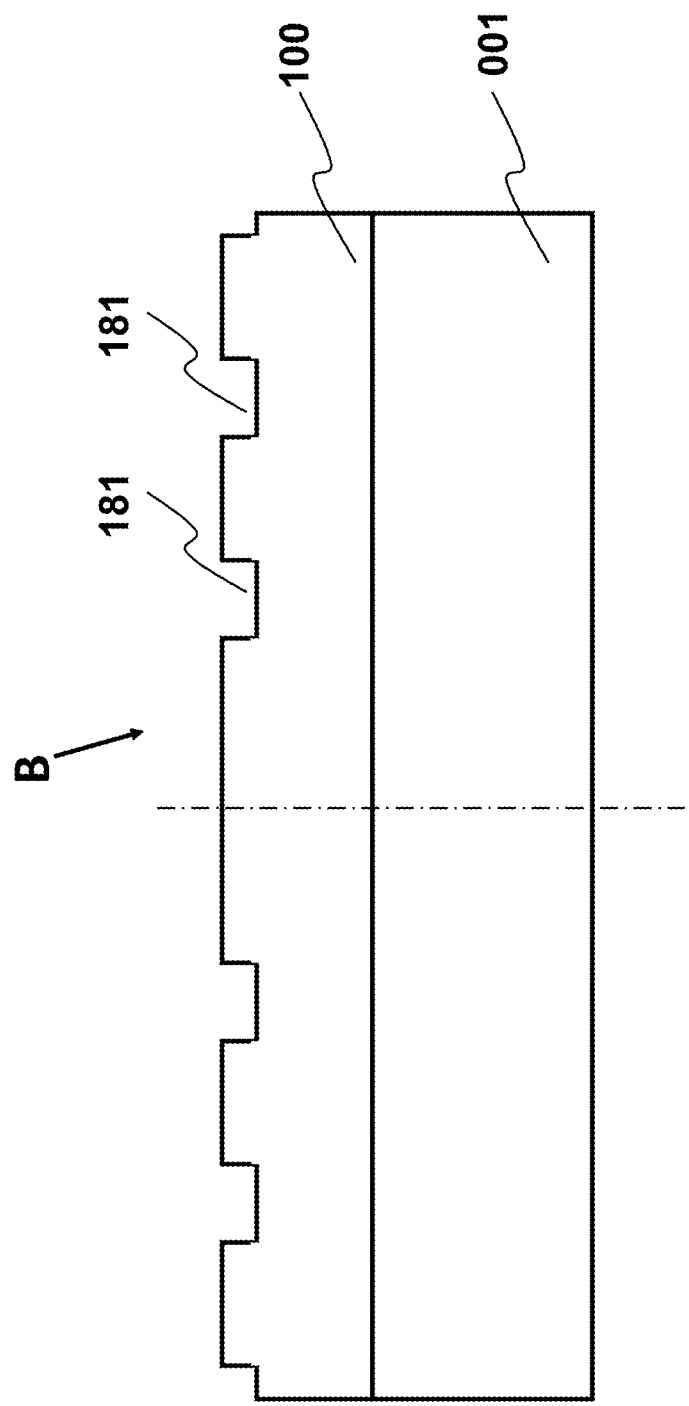
FIG. 9 illustrates a third step.
Figure 10:
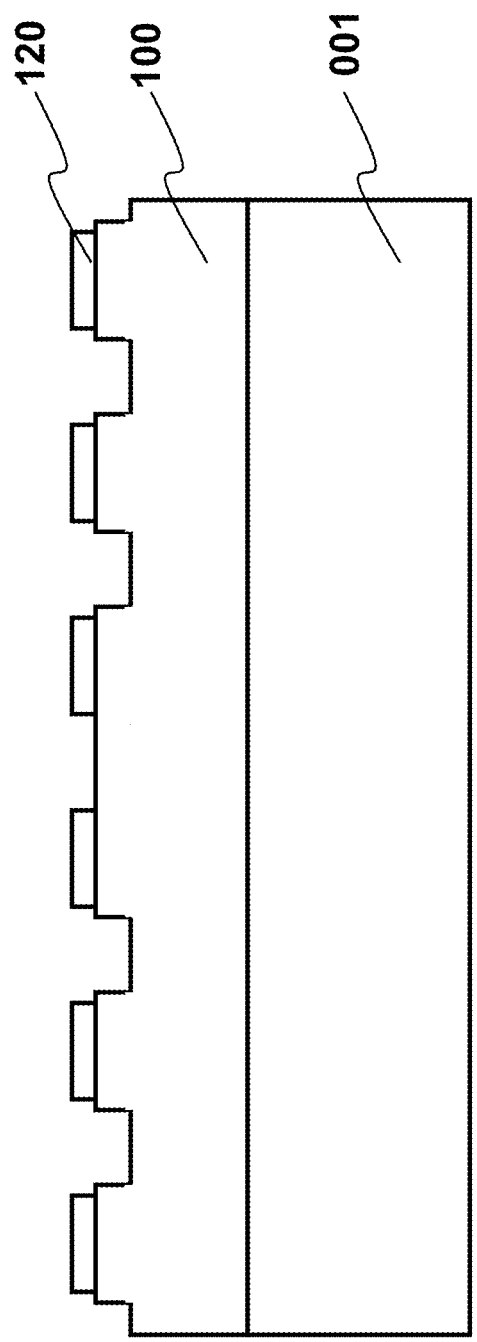
FIG. 10 illustrates a fourth step.
Figure 11:
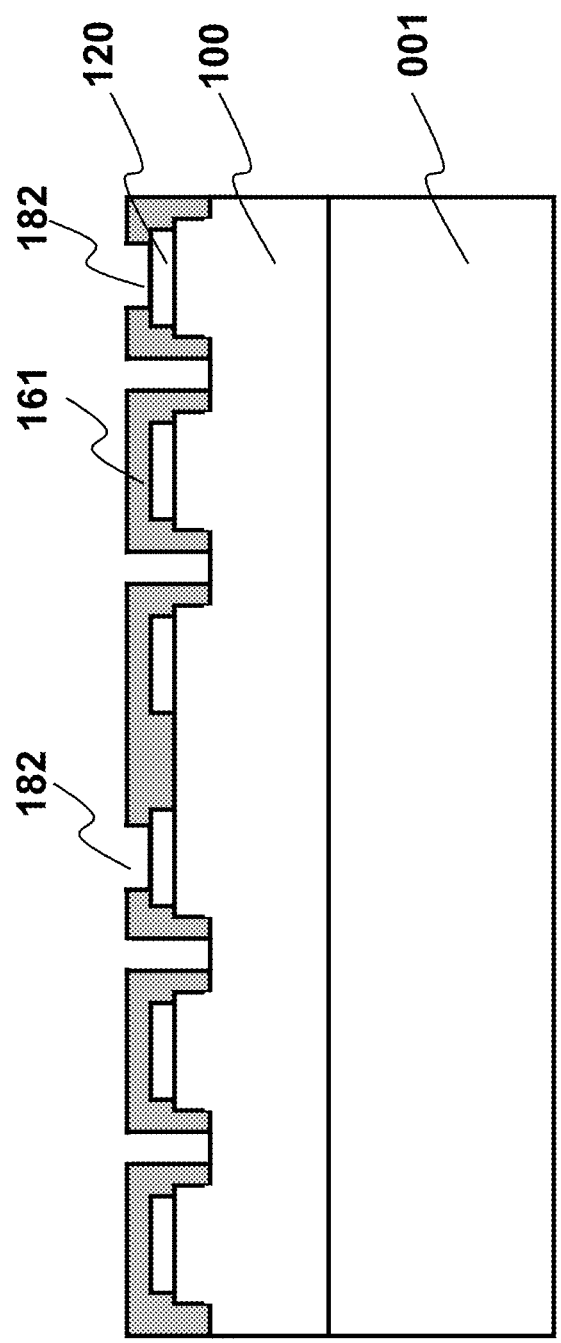
FIG. 11 illustrates a fifth step.
Figure 12:
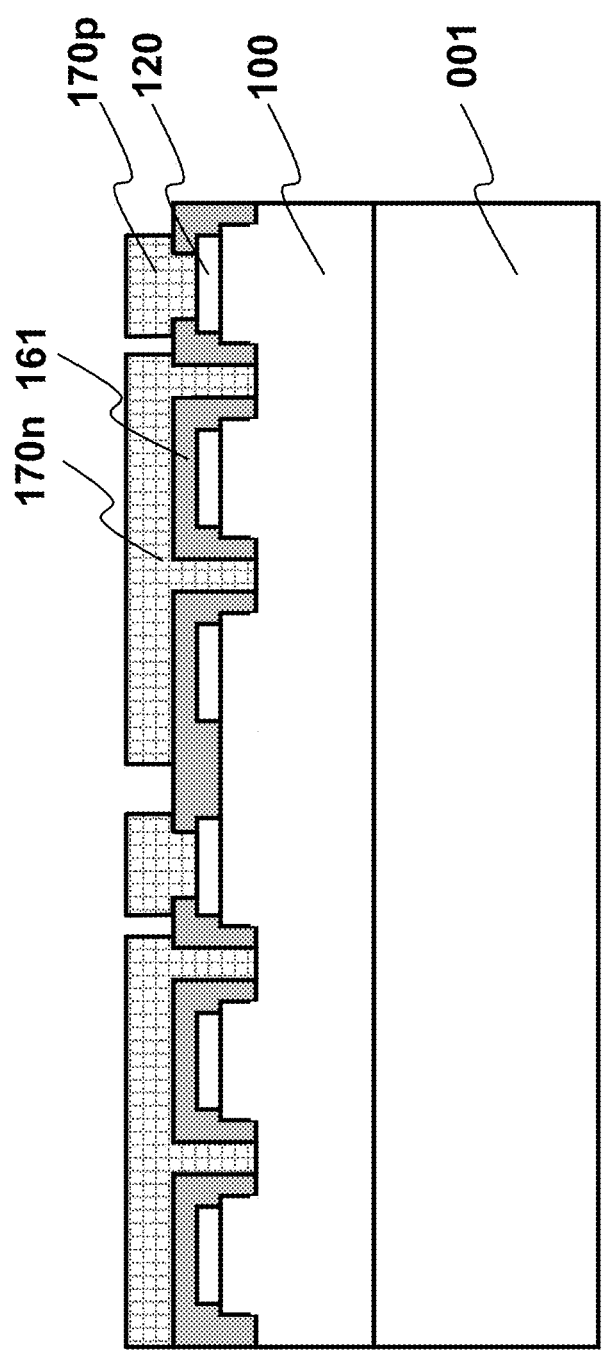
FIG. 12 illustrates a sixth step.
Figure 13:
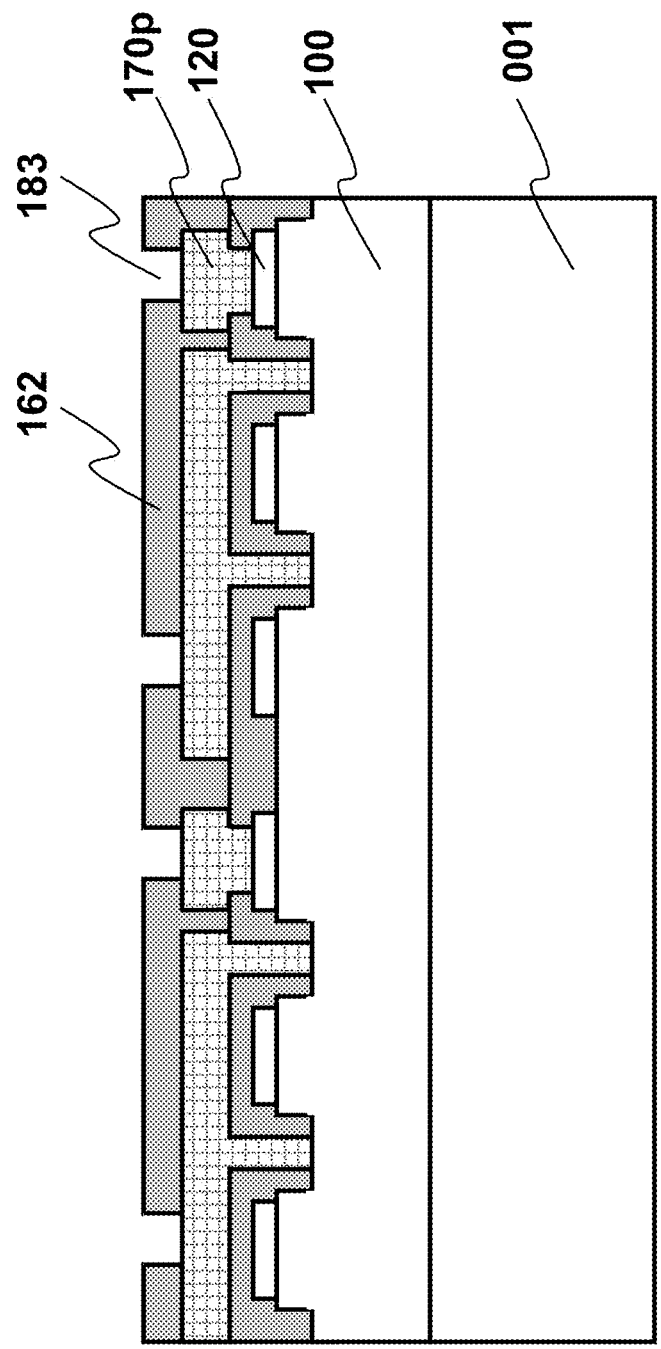
FIG. 13 illustrates a seventh step.
Figure 14:
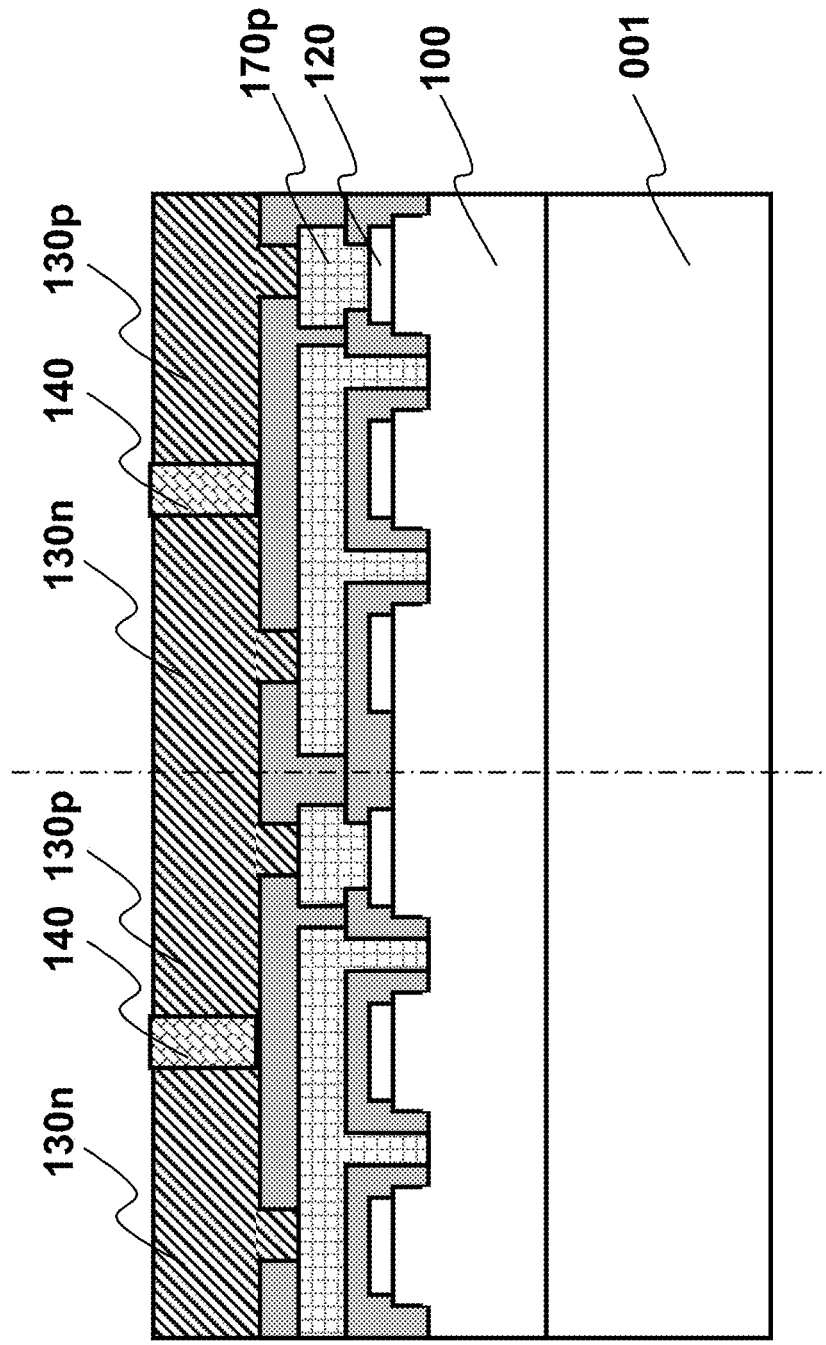
FIG. 14 illustrates an eighth step.
Figure 15:
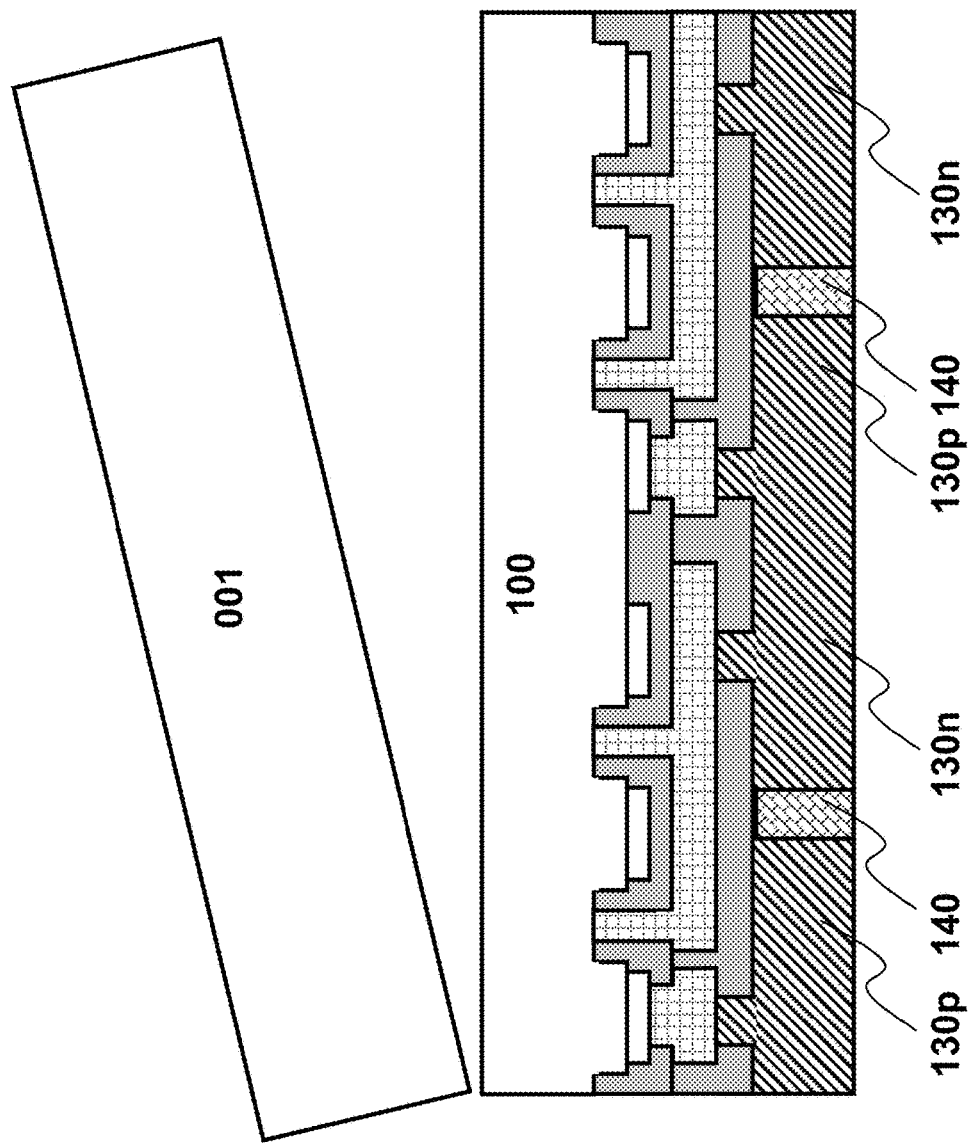
FIG. 15 illustrates a ninth step.
Figure 16:
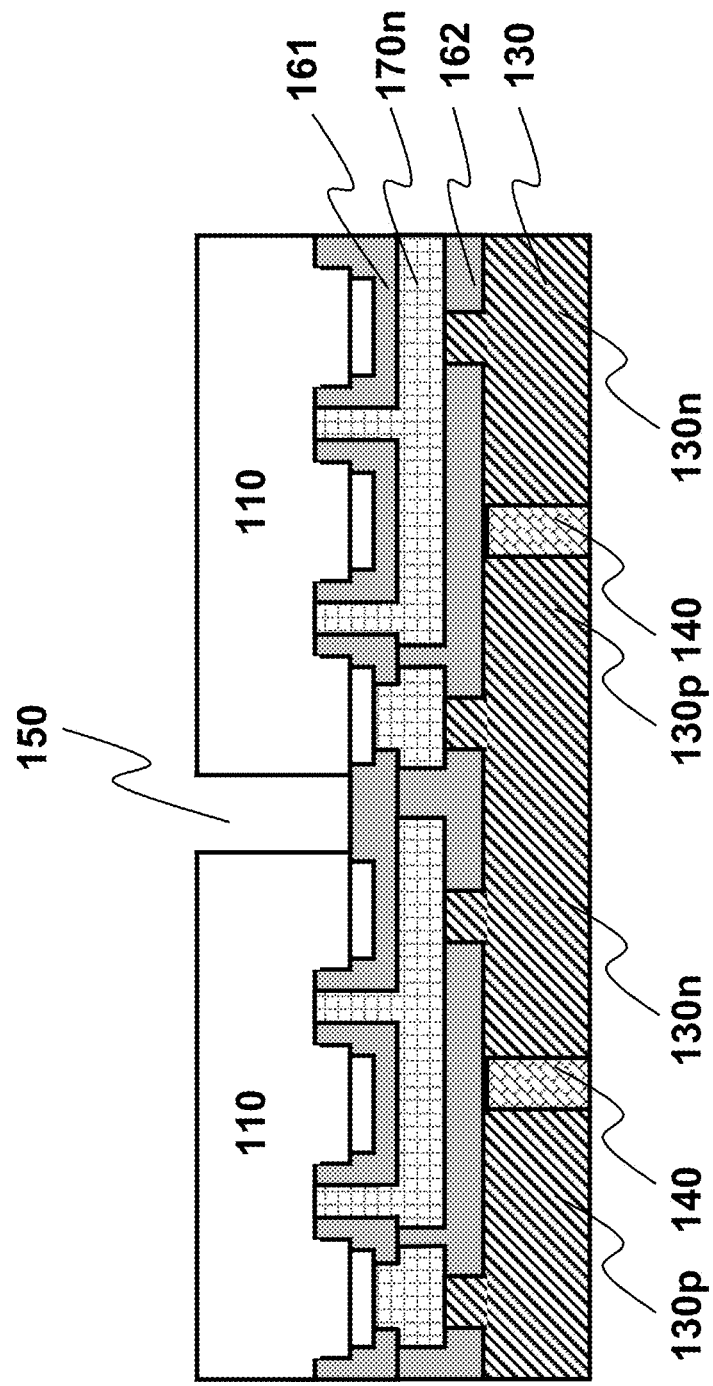
FIG. 16 illustrates a tenth step.

Next step is chip fabrication, comprising mesa etching, fabrication of ohmic contact layer, insulator and electrode pad, etc. Specifically:

1) Determine the cutting path 150 over the LED light-emitting laminated layer 110 as per size of the LED light-emitting epitaxial unit and divide the LED light-emitting laminated layer into a series of light-emitting units 100, as shown in FIG. 8;

2) Mesa etching: pattern the epitaxial laminated layer 110 with yellow light photolithography and open a plurality of first opening structures 181, which pass through the P-type epitaxial layer, the light-emitting layer and till the N-type epitaxial layer, through ICP dry etching at central regions of the LED light-emitting epitaxial units 110, as shown in FIG. 9;

3) Form an ohmic contact layer 120 over p-type epitaxial layer surface, as shown in FIG. 10, in which, the ohmic contact layer 120 can be made of high-reflectivity P-type ohmic contact material made of Cr, Ag, Ni, Al, Pt, Au, Ti or any of their combinations with total thickness not less than 0.5 µm and preferred thickness of 1 µm;

4) Form the first insulating layer 161 over the side walls of the ohmic contact layer 120 and the first opening structure 181 to expose the N-type epitaxial layer at the bottom of the first opening structure 181 and open at least one second opening structure 182 at the position of the first insulating layer 161 of LED light-emitting corresponding to the ohmic contact layer 120, as shown in FIG. 11;

5) Fabricate the conducting layer over the first insulating layer 161, and in each light-emitting unit, the conducting layer has electrically-isolated N conducting region 170*n* and the P conducting region 170*p*, in which, the N conducting region 170*n* fills in the first opening structure 181 and contacts with the N-type epitaxial layer, and the P conducting region 170*p* fills in the second opening structure 182 and contacts with the ohmic contact layer 120, as shown in FIG. 12;

6) Fabricate the second insulating layer 162 over the conducting layer, and open the third opening structure 183 at positions corresponding to the N conducting region 170*n* and the P conducting region 170*p* over the conducting layer, as shown in FIG. 13;

7) Fabricate the electrode pad layer 130 over the second insulating layer 162 through electroplating; taking each light-emitting unit 110 as one unit, divide the electrode pad layer 130 into electrically-isolated N electrode region 130*n* and P electrode region 130*p*, in which, insulating material is filled into gap between the P and N electrode regions to serve as the insulator 140. Except the LED light-emitting units at both ends, the P electrode region over the electrode pad layer of each LED light-emitting unit is connected to the N electrode region over the electrode pad layer of the adjacent LED light-emitting unit, thus forming a circuit connection plane with no height difference, as shown in FIG. 14. The electroplating can be made of Ni, Cu, Au or other metal material congruent melt with Sn, thickness of which is not less than 50 μm so that the electroplating layer of the light-emitting epitaxial structure is supported;

8) As shown in FIG. 15, remove the growth substrate 001 via known substrate lifting-off technology to expose the light-emitting epitaxial laminated layer surface;

9) Remove the light-emitting epitaxial laminated layers in the cutting path 150 through ICP dry etching to expose the first insulating layer 161, so as to form a series of LED light-emitting epitaxial units connected by the electrode pad layer, as shown in FIG. 16.

Figure 17:
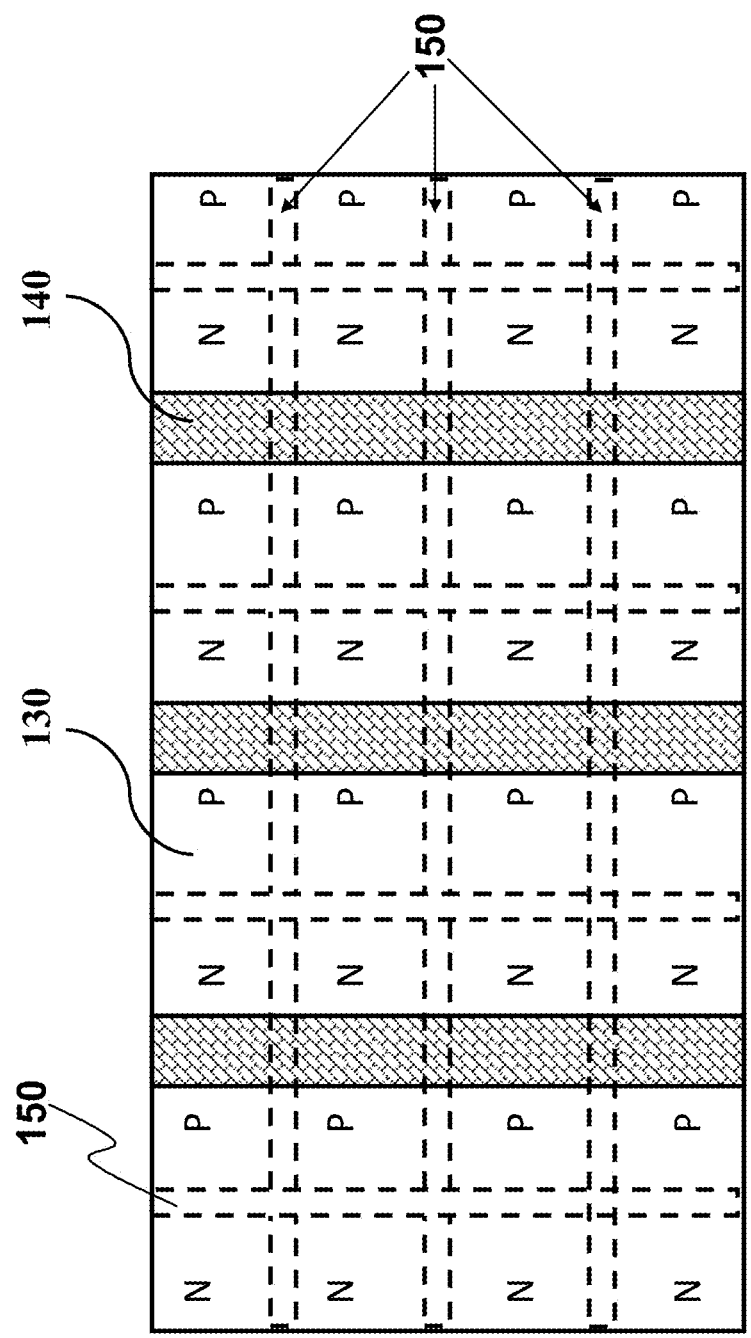
FIG. 17 illustrates an eleventh step.

In this way, the light-emitting epitaxial laminated layer is divided into a series of mutually-isolated units by the cutting path 150. With reference to FIG. 17, the P electrode region over the electrode pad layer of each unit is connected to the N electrode region over the electrode pad layer of its left unit, and to the P electrode regions over the electrode pad layers of its upper and lower units; and the N electrode region over the electrode pad layer of each unit is connected to the P electrode region over the electrode pad layer of its right unit and to the P electrode regions over the electrode pad layer of its upper and lower units, in which, the insulator 140 appears discontinuous line distribution.

Figure 18:
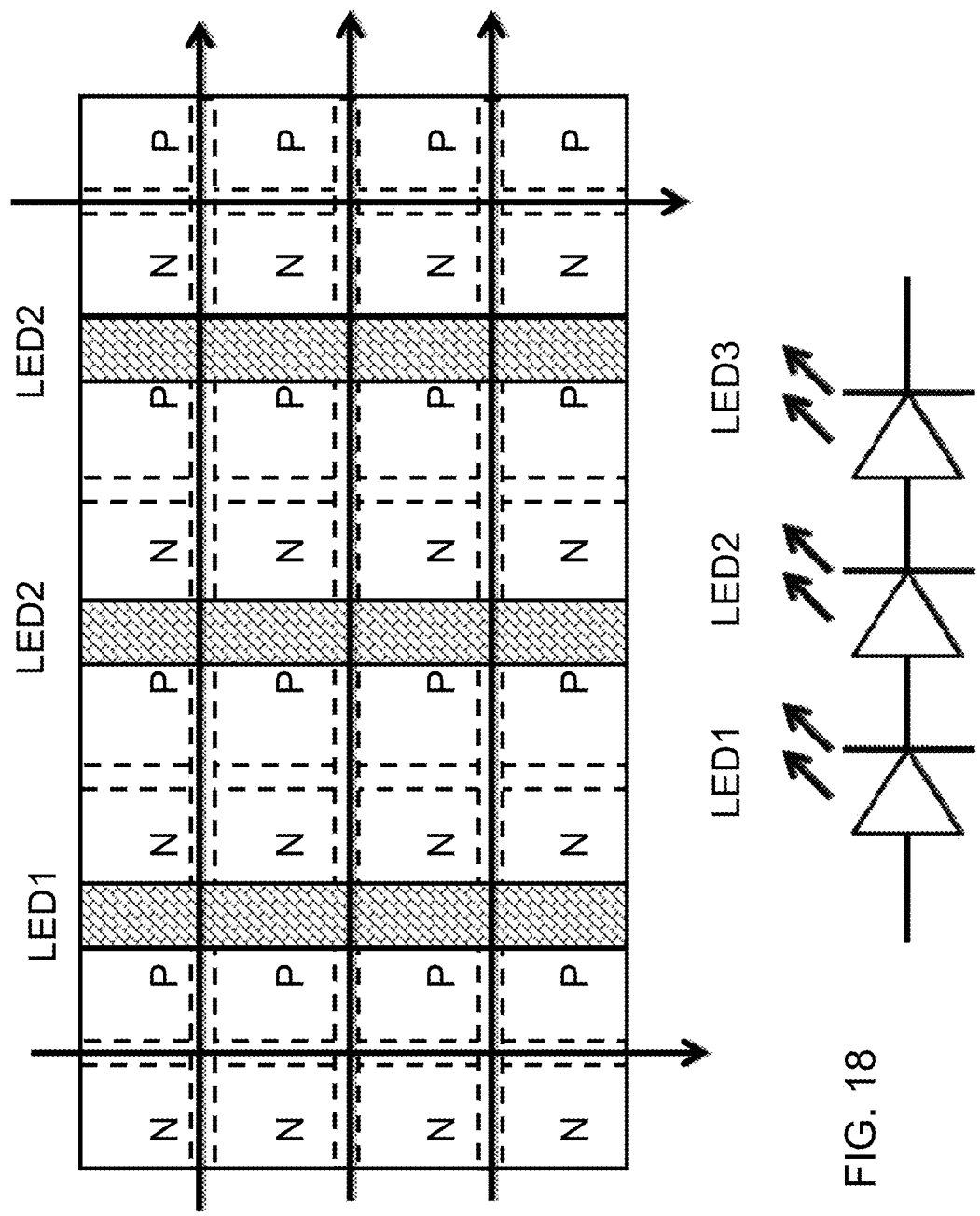
FIG. 18 illustrates a twelfth step.

Last step is chip cutting. With reference to FIG. 18, cut grains along the cutting path as per arrow direction in (a) to form a series of integrated LED light-emitting devices comprising a plurality of LED light-emitting epitaxial units. Its equivalent circuit is as shown in (b). In this embodiment, each LED light-emitting epitaxial unit is distributed by row, in which, the P and N electrode regions over the electrode pad layer of each line are consistently distributed, and are cut at each row at horizontal direction and cut at vertical direction subject to number of the light-emitting epitaxial units in series connection.

Alternative Embodiment 1

Figure 19:
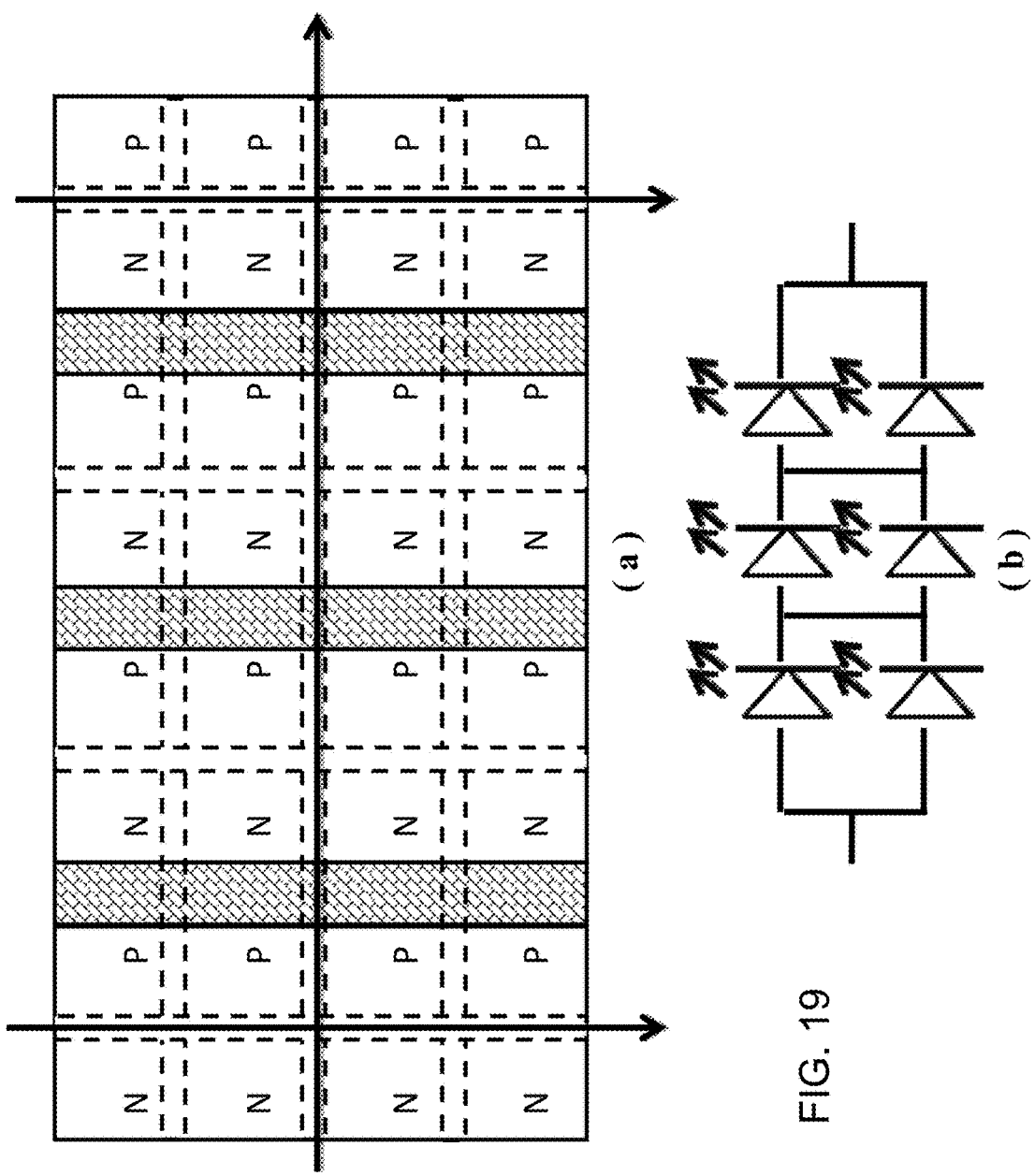
FIG. 19 shows a first variation of Embodiment 4.

With reference to FIG. 19, cut grains as per arrow line to obtain combination of 2*3 LEDs in series and parallel connection, the equivalent circuit of which is as shown in the figure.

Alternative Embodiment 2

Figure 20:
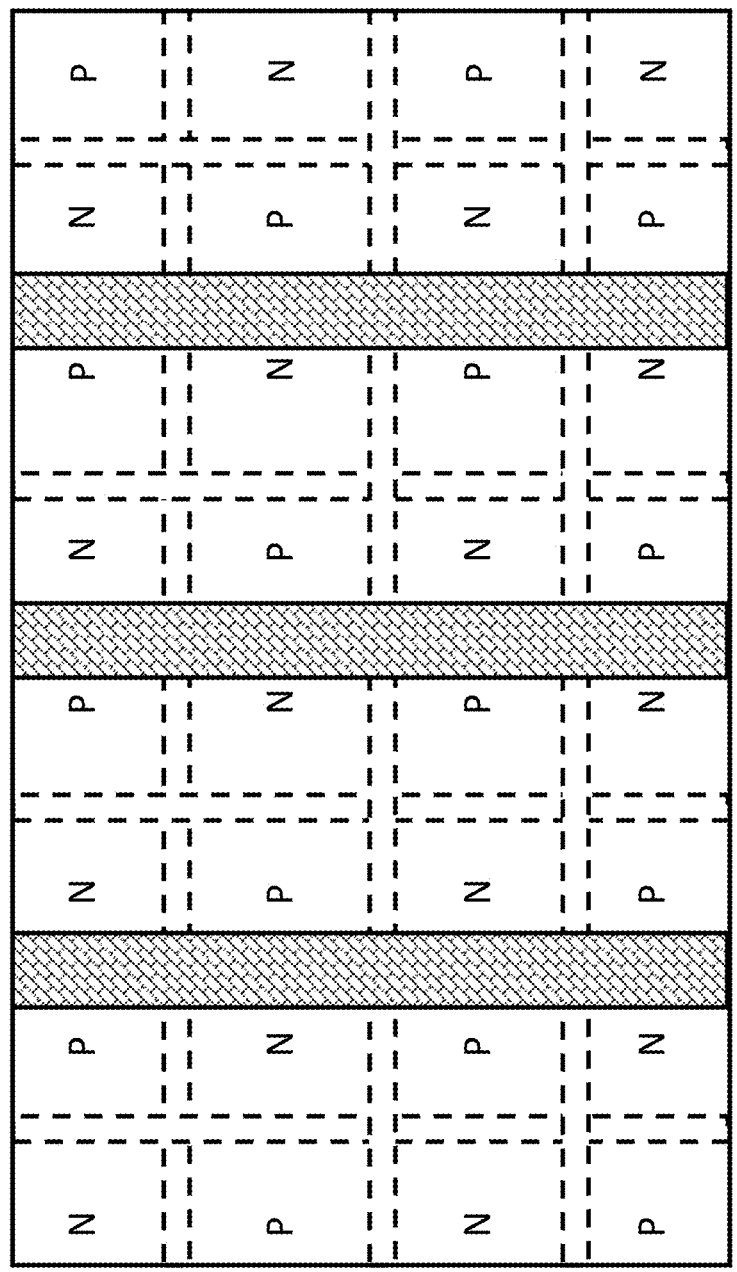
FIG. 20 illustrates a second variation of Embodiment 4.
Figure 21:
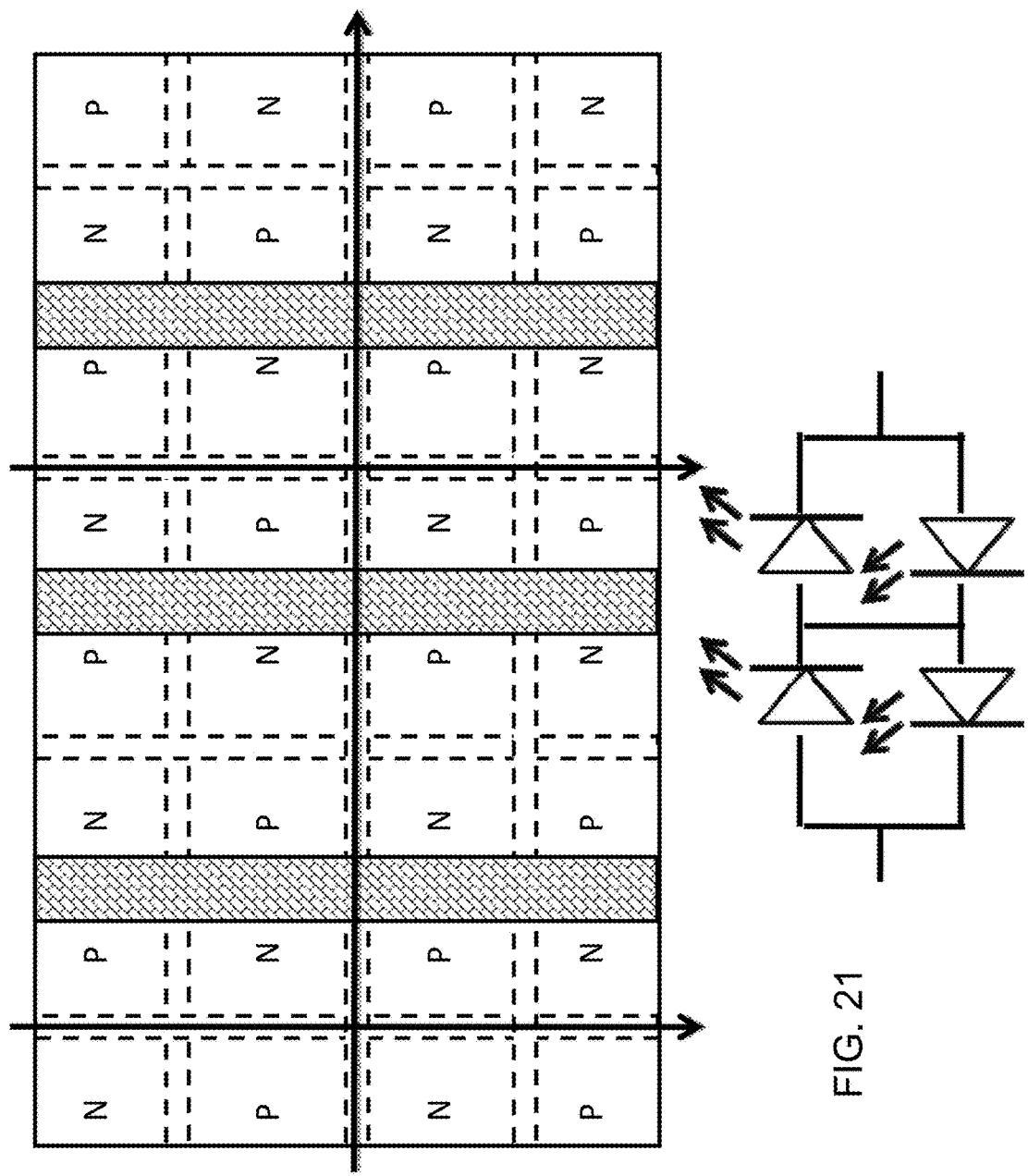
FIG. 21 shows another view.

In this embodiment, with reference to FIG. 20, an effect diagram by changing the photomask: the LED light-emitting epitaxial units are distributed by row (column), in which, the P and N electrode regions at odd-number row (column) over the electrode pad layer are inversely distributed from the P and N electrode regions at even-number row (column) over the electrode pad layer of each unit.

With reference to FIG. 14, cut grains as per arrow line to obtain combination of 2*2 LEDs in series and parallel connection, the equivalent circuit of which is as shown in the figure.

All references referred to in the present disclosure are incorporated by reference in their entirety. Although specific embodiments have been described above in detail, the description is merely for purposes of illustration. It should be appreciated, therefore, that many aspects described above are not intended as required or essential elements unless explicitly stated otherwise. Various modifications of, and equivalent acts corresponding to, the disclosed aspects of the exemplary embodiments, in addition to those described above, can be made by a person of ordinary skill in the art, having the benefit of the present disclosure, without departing from the spirit and scope of the disclosure defined in the following claims, the scope of which is to be accorded the broadest interpretation so as to encompass such modifications and equivalent structures.

The invention claimed is:

1. A light-emitting diode (LED), comprising:
an epitaxial structure having an upper and a lower surface, wherein the upper surface comprises a light-emitting surface;
at least one insulating layer over the lower surface; and
an electrode pad layer over the at least one insulating layer;
wherein:
the electrode pad layer comprises a P electrode region and an N electrode region;
the at least one insulating layer is configured to adjust a distribution of the P and N electrode regions over the electrode pad layer; and
the electrode pad layer is thicker than 50 μm to support the epitaxial structure.

2. The LED of claim 1, further comprising:
a first insulating layer and a conducting layer between the lower surface and the at least one insulating layer;
wherein the first insulating layer and the conducting layer is configured to uniformly inject current to the epitaxial structure.

3. The LED of claim 1, further comprising:
an insulator in the electrode pad layer to divide the electrode pad layer under the epitaxial structure into the P and N electrode regions,
wherein a lower surface of the insulator is not higher than a lower surface of the electrode pad layer.

4. A light-emitting diode (LED), comprising:
an epitaxial structure having an upper and a lower surface, wherein the upper surface comprises a light-emitting surface;
at least one insulating layer over the lower surface; and
an electrode pad layer over the at least one insulating layer;

wherein:
the electrode pad layer comprises a P electrode region and an N electrode region; and
the at least one insulating layer is configured to adjust a distribution of the P and N electrode regions over the electrode pad layer;
the LED further comprising:
an insulator in the electrode pad layer to divide the electrode pad layer under the epitaxial structure into the P and N electrode regions,
wherein a lower surface of the insulator is not higher than a lower surface of the electrode pad layer; and
wherein a height difference between the lower surface of the insulator and the lower surface of the electrode pad layer is 20 - 100 μm.

5. The LED of claim 3, wherein a melting or softening point of the insulator is lower than a melting point of the electrode pad layer.

6. A light-emitting diode (LED), comprising:
an epitaxial structure having an upper and a lower surface, wherein the upper surface comprises a light-emitting surface;
at least one insulating layer over the lower surface; and
an electrode pad layer over the at least one insulating layer;
wherein:
the electrode pad layer comprises a P electrode region and an N electrode region; and
the at least one insulating layer is configured to adjust a distribution of the P and N electrode regions over the electrode pad layer;
the LED further comprising:
an insulator in the electrode pad layer to divide the electrode pad layer under the epitaxial structure into the P and N electrode regions,
wherein a lower surface of the insulator is not higher than a lower surface of the electrode pad layer; and
wherein the insulator comprises a colloid material.

7. The LED of claim 1, wherein areas of the P and N electrode regions are same.

8. The LED of claim 1, wherein edges of the P and N electrode regions are beyond an edge of the epitaxial structure.

9. A light-emitting system comprising a plurality of integrated light-emitting diode (LED) devices, each device comprising:
at least two isolated LEDs forming a series, a parallel, or a series-parallel circuit;
wherein each LED comprises:
an epitaxial structure having an upper and a lower surface, wherein the upper surface comprises a light-emitting surface;
at least one insulating layer over the lower surface; and
an electrode pad layer over the at least one insulating layer;
wherein:
the electrode pad layer comprises a P electrode region and an N electrode region;
the at least one insulating layer is configured to adjust a distribution of the P and N electrode regions over the electrode pad layer;
each device further comprises an insulator in the electrode pad layer to divide the electrode pad layer under the epitaxial structure into the P and N electrode regions; and
a lower surface of the insulator is not higher than a surface of the electrode pad layer.

10. The system of claim 9, wherein the electrode pad layer has a sufficient thickness for supporting the epitaxial structure and coupling each LED in the integrated LED device to form a connection circuit plane with no height difference.

11. The system of claim 9, wherein the electrode pad layer is directly applied in surface-mounted technology (SMT) packaging.

* * * * *